US011282639B2

(12) United States Patent
Ichikawa

(10) Patent No.: US 11,282,639 B2
(45) Date of Patent: Mar. 22, 2022

(54) ANTENNA DEVICE AND ELECTRONIC APPARATUS

(71) Applicant: Murata Manufacturing Co., Ltd., Nagaokakyo (JP)

(72) Inventor: Keiichi Ichikawa, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 386 days.

(21) Appl. No.: 16/553,431

(22) Filed: Aug. 28, 2019

(65) Prior Publication Data

US 2019/0385787 A1    Dec. 19, 2019

Related U.S. Application Data

(63) Continuation of application No. PCT/JP2019/005629, filed on Feb. 15, 2019.

(30) Foreign Application Priority Data

Feb. 21, 2018    (JP) .............................. JP2018-028666

(51) Int. Cl.
| | |
|---|---|
| *H01F 38/14* | (2006.01) |
| *H02J 50/10* | (2016.01) |
| *H01F 27/02* | (2006.01) |
| *H01F 27/08* | (2006.01) |
| *H01F 27/24* | (2006.01) |
| *H05K 1/18* | (2006.01) |
| *H05K 7/14* | (2006.01) |

(52) U.S. Cl.
CPC ............. *H01F 38/14* (2013.01); *H01F 27/02* (2013.01); *H01F 27/08* (2013.01); *H01F 27/24* (2013.01);
(Continued)

(58) Field of Classification Search
CPC .......... H01F 38/14; H01F 27/02; H01F 27/08; H01F 27/24; H01F 27/025; H01F 27/36; H01F 27/22; H01F 2027/2809; H01F 27/2804; H01F 27/2876; H02J 50/10; H02J 50/12; H05K 1/18; H05K 7/1427;
(Continued)

(56) References Cited

U.S. PATENT DOCUMENTS 7,750,783 B2 * 7/2010 Hasegawa ............... H01F 38/14
                                                    336/61
9,941,576 B2 * 4/2018 Ito ........................... H01Q 7/06
(Continued)

FOREIGN PATENT DOCUMENTS

| JP | 2006-129605 A | 5/2006 |
| JP | 2008-177516 A | 7/2008 |

(Continued)

OTHER PUBLICATIONS

Official Communication issued in International Patent Application No. PCT/JP2019/005629, dated May 7, 2019.

*Primary Examiner* — Jared Fureman
*Assistant Examiner* — Michael J Warmflash
(74) *Attorney, Agent, or Firm* — Keating & Bennett, LLP

(57) ABSTRACT

An antenna device includes a base, a coil conductor, and a heat dissipation conductor. The coil conductor is provided on the base and wound in a spiral shape. The heat dissipation conductor is connected to the coil conductor. The heat dissipation conductor includes a connection end and an open end. The connection end is connected to the coil conductor. The open end is an end different from the connection end.

20 Claims, 10 Drawing Sheets

(52) U.S. Cl.
CPC ............... *H02J 50/10* (2016.02); *H05K 1/18* (2013.01); *H05K 7/1427* (2013.01); *H05K 2201/1003* (2013.01)

(58) Field of Classification Search
CPC .... H05K 2201/1003; H01P 1/30; H01Q 7/00; H01Q 7/06; H04B 5/02
See application file for complete search history.

(56) References Cited

U.S. PATENT DOCUMENTS

| | | | |
|---|---|---|---|
| 2015/0138030 A1* | 5/2015 | Yosui | H01Q 7/06 343/787 |
| 2015/0302967 A1* | 10/2015 | Jenkins | H01F 7/1607 335/298 |
| 2016/0043575 A1* | 2/2016 | Ichikawa | H02J 50/12 307/104 |
| 2016/0351327 A1* | 12/2016 | Shigematsu | H01F 17/00 |
| 2017/0005399 A1 | 1/2017 | Ito et al. | |

FOREIGN PATENT DOCUMENTS

| | | |
|---|---|---|
| JP | 2008-235860 A | 10/2008 |
| JP | 2008-258553 A | 10/2008 |
| JP | 2010-081571 A | 4/2010 |
| JP | 2013-080785 A | 5/2013 |
| JP | 2015-080072 A | 4/2015 |
| WO | 2015/147133 A1 | 10/2015 |

* cited by examiner

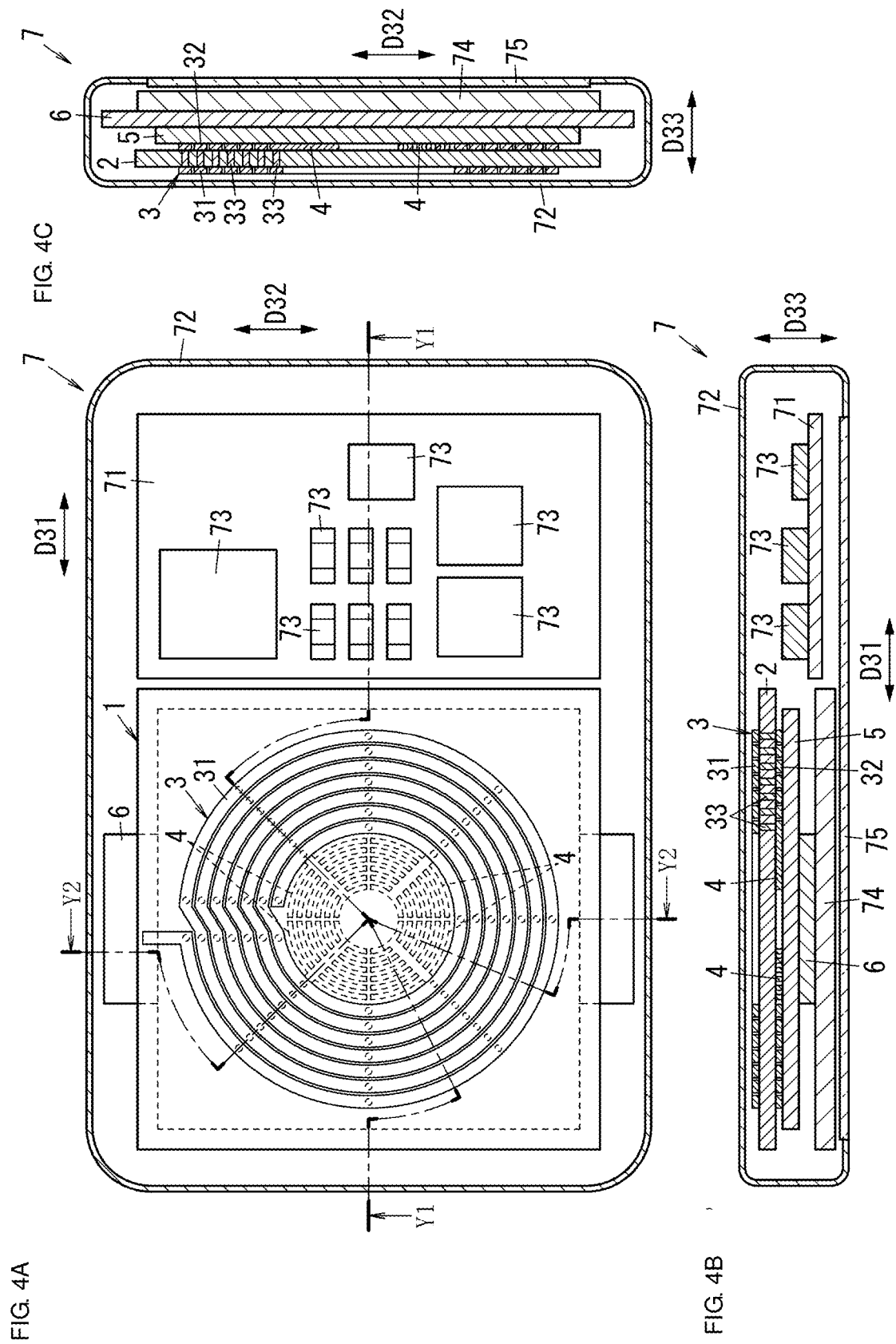

ANTENNA DEVICE AND ELECTRONIC APPARATUS

CROSS REFERENCE TO RELATED APPLICATIONS

This application claims the benefit of priority to Japanese Patent Application No. 2018-028666 filed on Feb. 21, 2018 and is a Continuation Application of PCT Application No. PCT/JP2019/005629 filed on Feb. 15, 2019. The entire contents of each application are hereby incorporated herein by reference.

BACKGROUND OF THE INVENTION

1. Field of the Invention

The present invention relates to an antenna device and an electronic apparatus, and more particularly, to an antenna device including a coil conductor and an electronic apparatus including the antenna device.

2. Description of the Related Art

An existing antenna device including a coil conductor has been known (see, for example, International Publication No. 2015/147133). International Publication No. 2015/147133 discloses a coil for non-contact charging.

Incidentally, as an antenna device becomes smaller in size, it is also necessary to reduce the thickness of the coil conductor. When the thickness of the coil conductor is reduced, a heat dissipation property of the coil conductor is not sufficiently obtained. That is, it is difficult to suppress surface temperature of the coil conductor from rising. In particular, it is required to reduce a temperature rise in a portion near a coil opening in the center of the coil conductor.

However, in the existing antenna device disclosed in International Publication No. 2015/147133, it is difficult to sufficiently enhance the heat dissipation property. Furthermore, when a metal plate is provided in the opening of the coil conductor for the purpose of enhancing the heat dissipation property, magnetic flux does not easily pass through the opening of the coil conductor, and sufficient transmission characteristics cannot be obtained.

SUMMARY OF THE INVENTION

Preferred embodiments of the present invention provide antenna devices and electronic apparatuses that are each capable of improving a heat dissipation property while securing easy passage of magnetic flux through an opening of a coil conductor.

An antenna device according to aspect preferred embodiment of the present invention performs wireless transmission through magnetic field coupling. The antenna device includes a base, a coil conductor, and a heat dissipation conductor. The coil conductor is provided on the base and wound in a spiral shape. The heat dissipation conductor is connected to the coil conductor. The heat dissipation conductor includes a connection end and an open end. The connection end is connected to the coil conductor. The open end is different from the connection end.

An electronic apparatus according to aspect preferred embodiment of the present invention includes an antenna device, a circuit board, and a housing. The antenna device performs wireless transmission through magnetic field coupling. The circuit board includes a system circuit that operates the antenna device. The housing accommodates the antenna device and the circuit board. The antenna device includes a base, a coil conductor, and a heat dissipation conductor. The coil conductor is provided on the base and wound in a spiral shape. The heat dissipation conductor is connected to the coil conductor. The heat dissipation conductor includes a connection end and an open end. The connection end is connected to the coil conductor. The open end is different from the connection end.

The antenna devices and the electronic apparatuses according to the preferred embodiments of the present invention are able to improve a heat dissipation property while securing easy passage of magnetic flux through an opening of the coil conductor.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 4A is a front view of an electronic apparatus according to the first preferred embodiment of the present invention. FIG. 4B is a cross-sectional view of the above-described electronic apparatus, taken along a line Y1-Y1 in FIG. 4A. FIG. 4C is a cross-sectional view of the above-described electronic apparatus, taken along a line Y2-Y2 in FIG. 4A.

DETAILED DESCRIPTION OF THE PREFERRED EMBODIMENTS

Figure 1A:
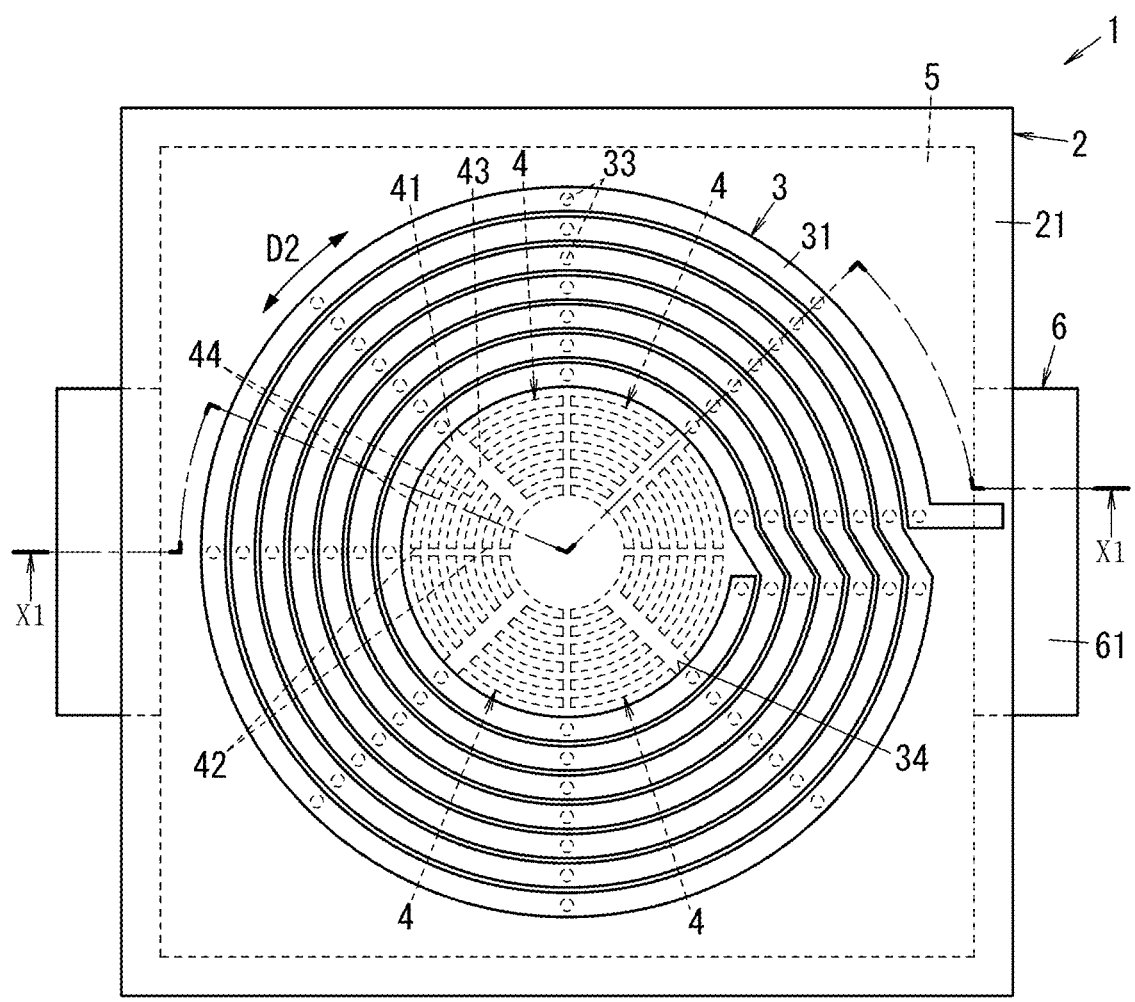
FIG. 1A is a front view of an antenna device according to a first preferred embodiment of the present invention.

Hereinafter, antenna devices and electronic apparatuses according to preferred embodiments of the present invention will be described with reference to the drawings. The drawings described in the preferred embodiments and the like described below are schematic diagrams, and ratios of sizes and thicknesses of respective elements in the drawings do not necessarily reflect actual dimension ratios. Additionally, FIG. 1B is a cross-sectional view taken along a line X1-X1 which is a zigzag line illustrated in FIG. 1A, so that the cross-sectional direction of FIG. 1B is changed along the way. FIG. 4B is a cross-sectional view taken along a line Y1-Y1 which is a zigzag line illustrated in FIG. 4A, so that the cross-sectional direction of FIG. 4B is changed along the way. FIG. 4C is a cross-sectional view taken along a line Y2-Y2 which is a zigzag line illustrated in FIG. 4A, so that the cross-sectional direction of FIG. 4C is changed along the way. FIG. 6B is a cross-sectional view taken along a line X2-X2 which is a zigzag line illustrated in FIG. 6A, so that the cross-sectional direction of FIG. 6B is changed along the way. FIG. 9B is a cross-sectional view taken along a line X3-X3 which is a zigzag line illustrated in FIG. 9A, so that the cross-sectional direction of FIG. 9B is changed along the way. FIG. 12B is a cross-sectional view taken along a line X4-X4 which is a zigzag line illustrated in FIG. 12A, so that the cross-sectional direction of FIG. 12B is changed along the way.

The "antenna device" according to each preferred embodiment of the present invention is preferably an antenna device used for a "wireless transmission system". Here, the "wireless transmission system" is a system that performs wireless transmission through a magnetic field coupling with a transmission partner (an antenna of an external apparatus). The "transmission" includes both transmitting and receiving a signal and transmitting and receiving power. Additionally, the "wireless transmission system" includes both meanings of a short-range wireless communication system and a wireless power feed system. Since the antenna device performs wireless transmission through magnetic field coupling, a length of a current path of the antenna device, that is, a line length of a coil conductor, which will be described later, is sufficiently smaller than a wave length λ at a frequency used in the wireless transmission, and is preferably equal to or less than about λ/10, for example. Accordingly, radiation efficiency of an electromagnetic wave is low in a used frequency band of the wireless transmission. Note that the wave length λ described herein is an effective wave length in consideration of wave length shortening effect by a dielectric property and magnetic permeability of a base on which the coil conductor is provided. Both ends of the coil conductor are preferably connected to a power feed circuit, and a current of uniform or substantially uniform magnitude flows through the current path of the antenna device, that is, the coil conductor.

Furthermore, examples of the short-range wireless communication used by the "antenna device" according to each preferred embodiment preferably include NFC (Near Field Communication), for example. A frequency band used for the short-range wireless communication is, for example, an HF band, and is particularly a frequency band of about 13.56 MHz and in the vicinity thereof.

Furthermore, examples of the wireless power feed method used in the "antenna device" according to each preferred embodiment include a magnetic field coupling method such as an electromagnetic induction method or a magnetic field resonance method. Examples of a wireless power feed standard for the electromagnetic induction method include the standard "Qi (registered trademark)" which is planned by WPC (Wireless Power Consortium). A frequency band used by the electromagnetic induction method is, for example, in a frequency band in a range of equal to or more than about 110 kHz and equal to or less than about 205 kHz and in the vicinity of the above range. Examples of a wireless power feed standard for the magnetic field resonance method include the standard "AirFuel (registered trademark) Resonant" which is planned by AirFuel Alliance. A frequency band used by the magnetic field resonance method is preferably, for example, a 6.78 MHz band or a 100 kHz band.

First Preferred Embodiment (1) Overall Configuration of Antenna Device

First, an overall configuration of an antenna device according to a first preferred embodiment of the present invention will be described with reference to the drawings.

Figure 1B:
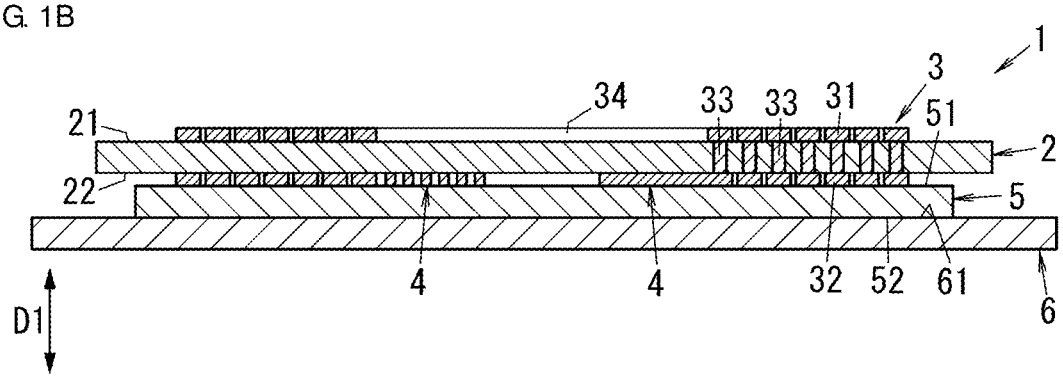
FIG. 1B is a cross-sectional view of the above-described antenna device, taken along a line X1-X1 in FIG. 1A.

As illustrated in FIGS. 1A and 1B, an antenna device 1 according to the first preferred embodiment includes a base 2, a coil conductor 3, and a plurality of (for example, four in the illustrated example) heat dissipation conductors 4. The coil conductor 3 is provided on the base 2 and wound in a spiral shape. Each of the plurality of heat dissipation conductors 4 is connected to the coil conductor 3.

In the antenna device 1 as described above, each of the heat dissipation conductors 4 preferably includes a connection end 41 and a plurality of (for example, 12 in the illustrated example) open ends 42. The connection end 41 is connected to the coil conductor 3. Each of the open ends 42 is an end that is different from the connection end 41.

The antenna device 1 performs transmission through magnetic field coupling.

According to the antenna device 1 as described above, it is possible to improve a heat dissipation property while securing easy passage of magnetic flux through an opening of the coil conductor 3.

As illustrated in FIGS. 4A to 4C, the antenna device 1 is preferably mounted on an electronic apparatus 7.

(2) Elements of Antenna Device

Next, elements of the antenna device 1 according to the first preferred embodiment will be described with reference to the drawings.

As illustrated in FIGS. 1A and 1B, the antenna device 1 preferably includes the base 2, the coil conductor 3, the plurality of (for example, four in the illustrated example) heat dissipation conductors 4, a magnetic body 5, and a thermal diffusion member 6. Additionally, the antenna device 1 further includes two connection terminals 11 (see FIG. 2), a first protective layer (not illustrated), and a second protective layer (not illustrated). The antenna device 1 preferably has a square or substantially square shape, for example, in a plan view from a first direction D1.

(2.1) Base

As illustrated in FIGS. 1A and 1B, the base 2 is preferably made from an electrically insulating material such as, for example, a resin or the like in a plate shape or a sheet shape, and includes a first main surface 21 and a second main surface 22 opposing each other. Examples of the electrically insulating material used for the base 2 include polyimide, PET (Poly Ethylene Terephthalate), and a Liquid Crystal Polymer (LCP. The base 2 preferably has a square shape in a plan view from the first direction D1. The size of the base 2 is large enough to provide the coil conductor 3.

(2.2) Coil Conductor

Figure 2:
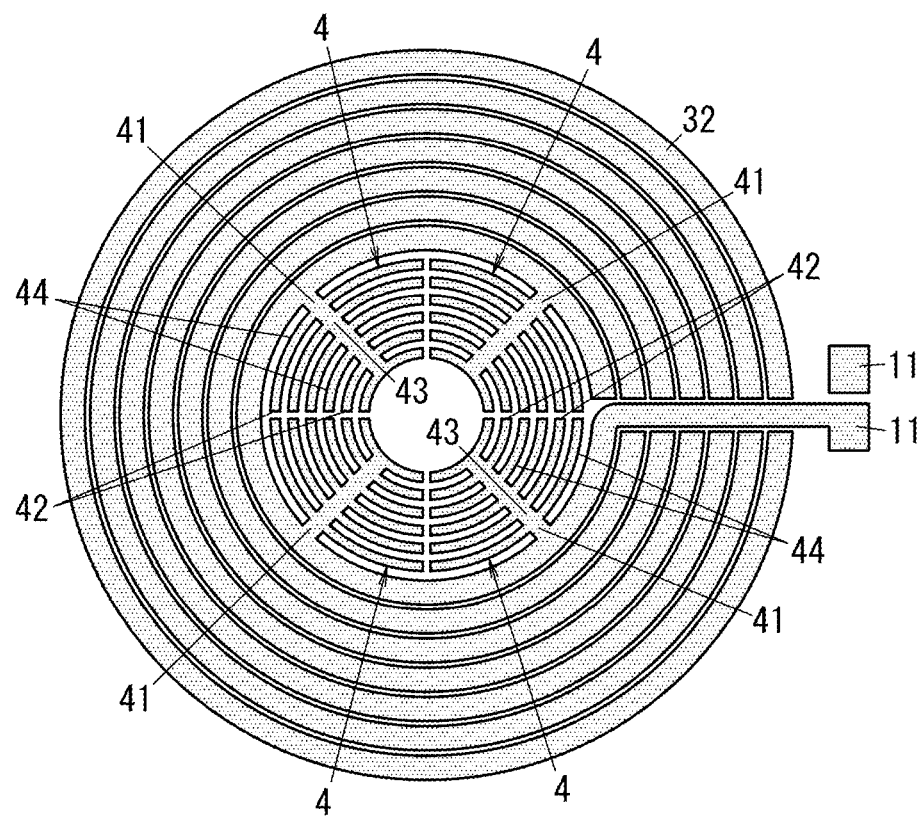
FIG. 2 is a front view of a second coil conductor portion and a heat dissipation conductor of the above-described antenna device.

As illustrated in FIGS. 1A, 1B, and FIG. 2, the coil conductor 3 is provided on the base 2, and is wound in a spiral shape. The coil conductor 3 includes an opening 34. More specifically, the coil conductor 3 includes a first coil conductor portion 31, a second coil conductor portion 32, and a plurality of via conductors 33. In order to reduce a resistance component of the coil conductor 3, the first coil conductor portion 31 and the second coil conductor portion 32 are electrically connected to each other in parallel, and the plurality of via conductors 33 electrically connects the first coil conductor portion 31 and the second coil conductor portion 32 to each other.

As illustrated in FIGS. 1A and 1B, the first coil conductor portion 31 preferably has a spiral shape around a first axis along the first direction D1. The first coil conductor portion 31 is preferably, wound about seven times. The first coil conductor portion 31 is preferably provided on the first main surface 21 of the base 2 using copper, aluminum, or the like. For example, by etching or printing, a copper film or an aluminum film is preferably formed on the first main surface 21 of the base 2, such that the first coil conductor portion 31 is provided on the first main surface 21 of the base 2.

In the same or similar manner as the first coil conductor portion 31, as illustrated in FIG. 1B and FIG. 2, the second coil conductor portion 32 preferably has a spiral shape around a second axis along the first direction D1. The second coil conductor portion 32 is preferably, for example, wound about seven times. The second coil conductor portion 32 is provided on the second main surface 22 (See FIG. 1B. The second main surface 22 of the base 2 is closer to the magnetic body 5 than the first main surface 21 in the first direction D1) of the base 2 preferably using copper, aluminum, or the like, for example. For example, by etching or printing, a copper film or an aluminum film is preferably formed on the second main surface 22 of the base 2, such that the second coil conductor portion 32 is provided on the second main surface 22 of the base 2. Note that the first main surface 21 of the base 2 and the second main surface 22 of the base 2 are parallel or substantially parallel to each other. Furthermore, the first main surface 21 of the base 2 and the second main surface 22 of the base 2 face each other, and a normal direction of the first main surface 21 of the base 2 and a normal direction of the second main surface 22 of the base 2 coincide or substantially coincide with the first direction D1.

Here, the coil conductor portion (the first coil conductor portion 31 and the second coil conductor portion 32) provided in a spiral shape may be a two-dimensional coil conductor having a shape wound in a spiral shape around a winding axis a plurality of times on a single plane, or may be a three-dimensional coil conductor having a shape wound in a helical shape around the winding axis along the winding axis a plurality of times. FIG. 1A and FIG. 2 each illustrate the two-dimensional coil conductor.

As illustrated in FIG. 1B, the first coil conductor portion 31 is preferably provided at a position farther from the magnetic body 5 than the second coil conductor portion 32 in the first direction D1 (a position on an upper side in FIG. 1B). On the other hand, the second coil conductor portion 32 is preferably provided at a position closer to the magnetic body 5 than the first coil conductor portion 31 in the first direction D1 (a position on a lower side in FIG. 1B). In other words, the second coil conductor portion 32 is closer to the magnetic body 5 than the first coil conductor portion 31.

The second coil conductor portion 32 is located at a position overlapping with the first coil conductor portion 31 in a plan view from the first direction D1. The second coil conductor portion 32 is disposed along the first coil conductor portion 31 in a plan view from the first direction D1. In other words, the second coil conductor portion 32 does not intersect with the first coil conductor portion 31, but is instead provided such that a lengthwise direction of the second coil conductor portion 32 is parallel or substantially parallel to a lengthwise direction of the first coil conductor portion 31.

As described above, by overlapping the second coil conductor portion 32 with the first coil conductor portion 31, it is possible to reduce or prevent the coil conductor 3 from increasing in size while making the opening 34 surrounded by the first coil conductor portion 31 and the second coil conductor portion 32 large.

The plurality of via conductors 33 are connected between the first coil conductor portion 31 and the second coil conductor portion 32 in parallel or substantially in parallel to one another, and penetrates through the base 2. As illustrated in FIG. 1A, the plurality of via conductors 33 are preferably provided at positions different from one another in a plan view from the first direction D1, and electrically connects the first coil conductor portion 31 and the second coil conductor portion 32 to each other. The plurality of via conductors 33 are provided at positions different from one another inside the base 2.

The first coil conductor portion 31 and the second coil conductor portion 32 are electrically connected to each other by the plurality of via conductors 33. With this configuration, since a current is able to flow through the via conductor 33 in the first direction D1 (a direction from the first coil conductor portion 31 toward the second coil conductor portion 32, or a direction from the second coil conductor portion 32 toward the first coil conductor portion 31), a resistance component is able to be made smaller than that in a case where the coil conductor is defined by only the first coil conductor portion 31 or by only the second coil conductor portion 32.

Furthermore, heat generated in the first coil conductor portion 31 is transmitted from the first coil conductor portion 31 to the second coil conductor portion 32 through the plurality of via conductors 33.

(2.3) Connection Terminal

As illustrated in FIG. 2, the two connection terminals 11 are provided on the base 2 (see FIG. 1A) in order to electrically connect a circuit board 71 (see FIG. 4A), which will be described later, of the electronic apparatus 7 and the coil conductor 3. The two connection terminals 11 are connected to both ends of the coil conductor 3, respectively, and are electrically insulated from portions other than both the ends of the coil conductor 3.

(2.4) First Protective Layer and Second Protective Layer

The first protective layer (not illustrated) covers the first coil conductor portion 31 provided on the first main surface 21 of the base 2, and protects the first coil conductor portion 31 from external force or the like. The first protective layer is preferably made by an electrically insulating material such as, for example, a resin or the like in a plate shape or a sheet shape. In a plan view from the first direction D1, a planar shape of the first protective layer is preferably the same or substantially the same as the shape of the base 2. The first protective layer is adhered to the first main surface 21 of the base 2 with an adhesive layer, which is not illustrated, interposed therebetween.

The second protective layer (not illustrated) covers the second coil conductor portion 32 provided on the second main surface 22 of the base 2, and protects the second coil conductor portion 32 from external force or the like. The second protective layer is preferably, in the same or similar manner as the first protective layer, made of an electrically insulating material such as a resin or the like in a plate shape or a sheet shape, for example. In a plan view from the first direction D1, a planar shape of the second protective layer is preferably the same or substantially the same as the shape of the base 2. The second protective layer is adhered to the second main surface 22 of the base 2 with an adhesive layer, which is not illustrated, interposed therebetween.

(2.5) Magnetic Body

As illustrated in FIGS. 1A and 1B, in a plan view of the base 2, the magnetic body 5 at least partially overlaps with the coil conductor 3. More specifically, the magnetic body 5 to opposes the second coil conductor portion 32 in the first direction D1. The magnetic body 5 is preferably made of a ferromagnetic material such as ferrite or the like in a quadrangular plate shape or a quadrangular sheet shape, for example. The magnetic body 5 includes a first main surface 51 and a second main surface 52. The magnetic body 5 has higher magnetic permeability than that of the base 2. Examples of the ferromagnetic material used for the magnetic body 5 include Ni—Zn—Cu based ferrite or hexagonal ferrite. Note that in the first preferred embodiment, the first main surface 51 of the magnetic body 5 and the second main surface 52 of the magnetic body 5 are preferably parallel or substantially parallel to each other. Furthermore, the first main surface 51 of the magnetic body 5 and the second main surface 52 of the magnetic body 5 face each other, and a normal direction of the first main surface 51 of the magnetic body 5 and a normal direction of the second main surface 52 of the magnetic body 5 coincide or substantially coincide with the first direction D1.

The magnetic body 5 is preferably closer to the second coil conductor portion 32 than to the first coil conductor portion 31. The first main surface 51 of the magnetic body 5 faces the second coil conductor portion 32 in the first direction D1, and the second main surface 52 of the magnetic body 5 faces the thermal diffusion member 6 in the first direction D1.

(2.6) Heat Dissipation Conductor

Each of the plurality of heat dissipation conductors 4 is connected to the coil conductor 3 as illustrated in FIGS. 1A, 1B, and FIG. 2. More specifically, each of the heat dissipation conductors 4 is preferably directly connected to the second coil conductor portion 32 of the coil conductor 3.

Each of the heat dissipation conductors 4 preferably includes the connection end 41 and the plurality of (for example, 12 in the illustrated example) open ends 42. The connection end 41 is connected to the coil conductor 3. More specifically, the connection end 41 is preferably directly connected to the second coil conductor portion 32 of the coil conductor 3. Each of the plurality of open ends 42 is an end that is different from the connection end 41. With this configuration, it is possible to improve the heat dissipation property while securing easy passage of magnetic flux through the opening 34 of the coil conductor 3. In the present specification, the "connection end" refers to an end that is connected to the conductor, and the "open end" refers to an end that is not connected to the conductor.

Moreover, each of the heat dissipation conductors 4 is connected to the coil conductor 3 at the one connection end 41, and a plurality of connection ends 41 is not provided in each of the heat dissipation conductors 4. Therefore, a loop current path is not provided by a portion of each of the heat dissipation conductors 4 and a portion of the coil conductor 3. With this configuration, it is possible to improve the heat dissipation property while securing easy passage of magnetic flux through the opening 34 of the coil conductor 3.

Each of the heat dissipation conductors 4 preferably includes a first conductor portion 43 and a plurality of (for example, 12 in the illustrated example) second conductor portions 44. The first conductor portion 43 is connected to the connection end 41 and extends from the connection end 41 in a direction intersecting with a winding direction D2 of the coil conductor 3 in a plan view of the coil conductor 3. Each of the plurality of second conductor portions 44 is preferably connected to the first conductor portion 43, and extends from the first conductor portion 43 along the winding direction D2 of the coil conductor 3 in a plan view of the coil conductor 3. Here, the winding direction D2 of the coil conductor 3 is the same as a direction along the current path of the coil conductor 3.

Each of the heat dissipation conductors 4 according to the first preferred embodiment is positioned within the opening 34 of the coil conductor 3 in a plan view of the base 2. In the first preferred embodiment, each of the heat dissipation conductors 4 is positioned within the opening of the second coil conductor portion 32 in a plan view from the first direction D1. In addition, each of the heat dissipation conductors 4 is preferably not only positioned within the opening of the second coil conductor portion 32 but also positioned within the opening of the first coil conductor portion 31 in a plan view from the first direction D1.

The connection end 41 of each of the heat dissipation conductors 4 is provided so as to be adjacent to (close to) a portion where at least one of the plurality of via conductors 33 and the first coil conductor portion 31 or the second coil conductor portion 32 are connected, in a plan view from the first direction D1. In other words, at least one of the plurality of via conductors 33 is provided at the portion where the coil conductor 3 and the heat dissipation conductor 4 are connected to each other. With this configuration, not only heat generated in the second coil conductor portion 32 but also heat generated in the first coil conductor portion 31 is able to be transmitted to the heat dissipation conductor 4. That is, by arranging the via conductor 33 to which the heat generated in the first coil conductor portion 31 and the second coil conductor portion 32 is concentrated and the connection end 41 of the heat dissipation conductor 4 near each other, the heat is able to be efficiently transmitted to the heat dissipation conductor 4.

(2.7) Thermal Diffusion Member

The thermal diffusion member 6 illustrated in FIGS. 1A and 1B is a member having thermal conductivity higher than that of the base 2. The thermal diffusion member 6 is preferably, for example, a thermal diffusion sheet such as graphite or the like, for example.

The thermal diffusion member 6 overlaps with at least the heat dissipation conductor 4 in a plan view of the base 2. More specifically, the thermal diffusion member 6 overlaps with the plurality of heat dissipation conductors 4 with the magnetic body 5 interposed therebetween on a main surface 61 side.

The thermal diffusion member 6 preferably extends from the opening 34 of the coil conductor 3 to an outer side portion relative to an outer circumference of the coil conductor 3 over the coil conductor 3 in a plan view of the base 2. Note that the thermal diffusion member 6 need not extend to the outer side portion relative to the outer circumference of the coil conductor 3. In short, it is sufficient for the thermal diffusion member 6 to overlap with at least the heat dissipation conductor 4.

(3) Heat Conduction of Antenna Device

Figure 3:
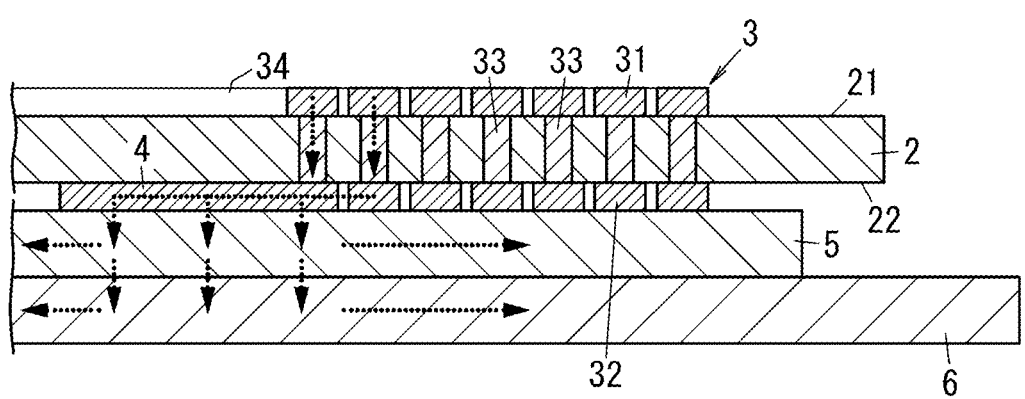
FIG. 3 is a schematic diagram for explaining operations of the above-described antenna device.

Next, heat conduction in the antenna device 1 will be described with reference to FIG. 3. The arrows in FIG. 3 indicate an example of heat flow.

First, the heat generated in the second coil conductor portion 32 of the coil conductor 3 is transmitted to the heat dissipation conductor 4 provided on the second main surface 22 of the base 2 in the same or substantially the same manner as the second coil conductor portion 32. The heat transmitted to the heat dissipation conductor 4 is transmitted to the magnetic body 5 from the heat dissipation conductor 4 while being transmitted toward the center of gravity of the coil conductor 3 in the heat dissipation conductor 4. The heat transmitted to the magnetic body 5 is transmitted to the thermal diffusion member 6 while being diffused in the magnetic body 5. The heat transmitted to the thermal diffusion member 6 is diffused in the thermal diffusion member 6.

On the other hand, the heat generated in the first coil conductor portion 31 of the coil conductor 3 is transmitted to the second coil conductor portion 32 through the plurality of via conductors 33. The heat transmitted to the second coil conductor portion 32 through the plurality of via conductors 33 is transmitted to the heat dissipation conductor 4. The heat transmitted to the heat dissipation conductor 4 is transmitted to the magnetic body 5 from the heat dissipation conductor 4 while being transmitted toward the center of gravity of the coil conductor 3 in the heat dissipation conductor 4. The heat transmitted to the magnetic body 5 is transmitted to the thermal diffusion member 6 while being diffused in the magnetic body 5. The heat transmitted to the thermal diffusion member 6 is diffused in the thermal diffusion member 6.

With this configuration, the heat generated in the coil conductor 3 is able to be dissipated to the outside by the heat dissipation conductor 4.

(4) Electronic Apparatus

As illustrated in FIGS. 4A to 4C, the electronic apparatus 7 preferably includes the antenna device 1, the circuit board 71, and a housing 72. Examples of the electronic apparatus 7 include a cellular phone including a smartphone, a wearable device, a wristwatch terminal, a headphone, and a hearing aid. The circuit board 71 includes a system circuit that operates the antenna device 1. The housing 72 accommodates the antenna device 1 and the circuit board 71. The housing 72 preferably has a rectangular or substantially rectangular parallelepiped shape and has a lengthwise direction D31, a widthwise direction D32, and a height direction D33. Furthermore, the electronic apparatus 7 preferably includes, for example, a circuit element 73 provided on the circuit board 71, a battery 74 that drives the electronic apparatus 7, and a display device 75 that displays predetermined information. The antenna device 1 is accommodated in the housing 72 such that the axial direction (first direction D1) of the coil conductor 3 is along the height direction D33, and includes the thermal diffusion member 6 as described above.

In the antenna device 1 accommodated in the housing 72, the thermal diffusion member 6 overlaps with at least the heat dissipation conductor 4 in a plan view of the base 2, and extends until reaching an edge end portion of the housing 72 in the widthwise direction D32 of the housing 72. With this configuration, the heat generated in the coil conductor 3 is transmitted to the heat dissipation conductor 4. The heat transmitted to the heat dissipation conductor 4 is transmitted from the heat dissipation conductor 4 to the thermal diffusion member 6, and is further transmitted to the housing 72. Although it is preferable that the thermal diffusion member 6 is in direct contact with the edge end portion of the housing 72, the thermal diffusion member 6 and the edge end portion of the housing 72 need not be in direct contact with each other, and a predetermined gap may be provided between the thermal diffusion member 6 and the edge end portion of the housing 72.

(5) Advantageous Effects

As described above, in the antenna device 1 according to the first preferred embodiment, the heat dissipation conductor 4 connected to the coil conductor 3 is provided. With this configuration, it is possible to improve the heat dissipation property while securing easy passage of magnetic flux through the opening 34 of the coil conductor 3.

In the antenna device 1 according to the first preferred embodiment, the heat dissipation conductor 4 preferably includes the first conductor portion 43 extending in the direction intersecting with the winding direction D2 of the coil conductor 3. With this configuration, the heat is able to be transmitted to a region having low temperature (a region close to the center of gravity of the coil conductor 3).

In the antenna device 1 according to the first preferred embodiment, the heat dissipation conductor 4 includes the second conductor portion 44 extending along the winding direction D2 of the coil conductor 3. With this configuration, the heat dissipation region is able to be increased, and thus the heat dissipation property is able to be improved in a limited space.

In the antenna device 1 according to the first preferred embodiment, the heat dissipation conductor 4 is positioned within the opening 34 of the coil conductor 3 in a plan view of the base 2. With this configuration, the heat dissipation property is able to be improved without changing the area of the entire antenna device 1.

In the antenna device 1 according to the first preferred embodiment, the magnetic body 5 at least partially overlapping with the coil conductor 3 is provided. With this configuration, a desired inductance is able to be obtained.

Furthermore, in the antenna device 1 according to the first preferred embodiment, by providing the magnetic body 5, the heat is able to be transmitted from the coil conductor 3 to the magnetic body 5, and thus the heat dissipation property is able to be improved.

In the antenna device 1 according to the first preferred embodiment, the thermal diffusion member 6 having the thermal conductivity higher than that of the base 2 is provided so as to overlap with the heat dissipation conductor 4. With this configuration, the heat transmitted to the heat dissipation conductor 4 is able to be transmitted to the thermal diffusion member 6, and thus the heat dissipation property is able to be further improved.

In the antenna device 1 according to the first preferred embodiment, the thermal diffusion member 6 extends from the opening 34 of the coil conductor 3 to the outer side portion relative to the outermost circumference of the coil conductor 3. With this configuration, the heat dissipation property in the thermal diffusion member 6 is able to be further improved.

In the antenna device 1 according to the first preferred embodiment, the first coil conductor portion 31 and the second coil conductor portion 32 are connected to each other in parallel by the plurality of via conductors 33. With this configuration, the resistance component of the coil conductor 3 is able to be reduced.

In the antenna device 1 according to the first preferred embodiment, at least one of the plurality of via conductors 33 is provided at a portion where the coil conductor 3 and the heat dissipation conductor 4 are connected to each other. With this configuration, the heat conduction from the first coil conductor portion 31 and the second coil conductor portion 32 to the heat dissipation conductor 4 is able to be improved.

In the electronic apparatus 7 according to the first preferred embodiment, the thermal diffusion member 6 extends to the edge end portion of the housing 72. With this configuration, the heat conduction from the thermal diffusion member 6 to the housing 72 is able to be increased, and thus the heat dissipation property is able to be further improved.

(6) Modifications

Modifications of the first preferred embodiment will be described below.

Figure 5A:
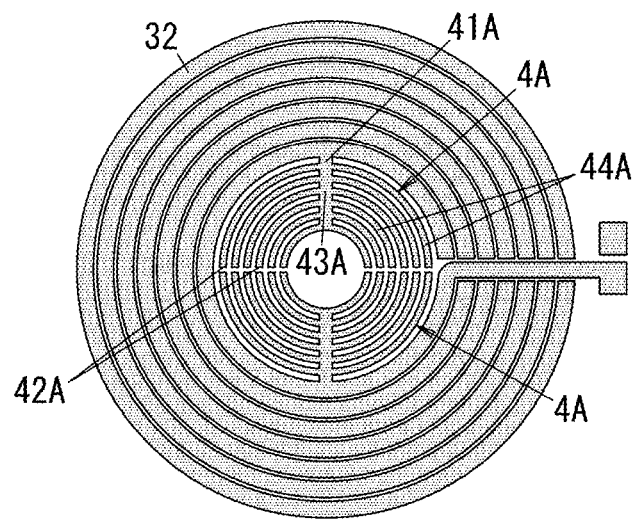
FIG. 5A is a front view of a second coil conductor portion and a heat dissipation conductor of an antenna device according to a first modification of the first preferred embodiment of the present invention.

As a first modification of the first preferred embodiment, the antenna device 1 may include a plurality of (for example, two in the illustrated example) heat dissipation conductors 4A each having a shape as illustrated in FIG. 5A instead of the plurality of heat dissipation conductors 4 (see FIG. 2). Each of the heat dissipation conductors 4A preferably includes a connection end 41A and a plurality of open ends 42A. Each of the heat dissipation conductors 4A includes a first conductor portion 43A and a plurality of (for example, 12 in the illustrated example) second conductor portions 44A. The first conductor portion 43A is connected to the connection end 41A and extends from the connection end 41A in the direction intersecting with the winding direction D2 (see FIG. 1A) of the coil conductor 3 in a plan view of the coil conductor 3 (second coil conductor portion 32). Each of the plurality of second conductor portions 44A is connected to the first conductor portion 43A, and extends from the first conductor portion 43A along the winding direction D2 of the coil conductor 3 in a plan view of the coil conductor 3 (second coil conductor portion 32).

Figure 5B:
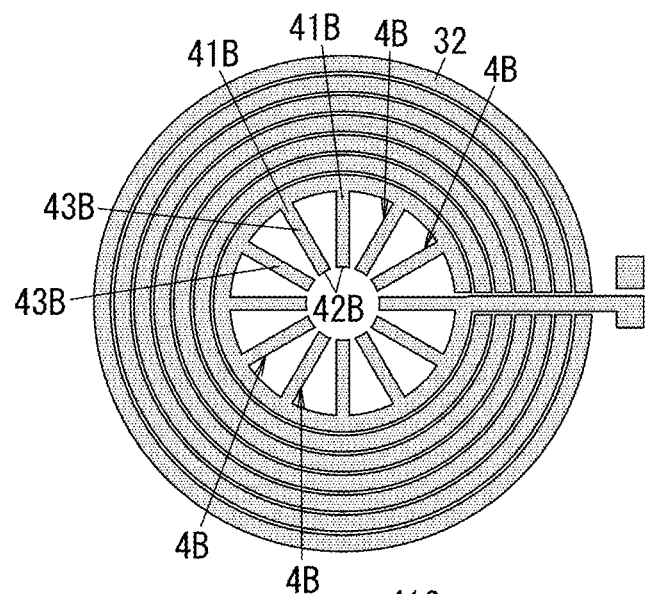
FIG. 5B is a front view of a second coil conductor portion and a heat dissipation conductor of an antenna device according to a second modification of the first preferred embodiment of the present invention.

As a second modification of the first preferred embodiment, the antenna device 1 may include a plurality of (for example, 12 in the illustrated example) heat dissipation conductors 4B each having a shape as illustrated in FIG. 5B instead of the plurality of heat dissipation conductors 4. Each of the heat dissipation conductors 4B preferably includes a connection end 41B, an open end 42B, and a first conductor portion 43B. The first conductor portion 43B is connected to the connection end 41B and extends from the connection end 41B in the direction intersecting with the winding direction D2 (see FIG. 1A) of the coil conductor 3 in a plan view of the coil conductor 3 (second coil conductor portion 32).

Figure 5C:
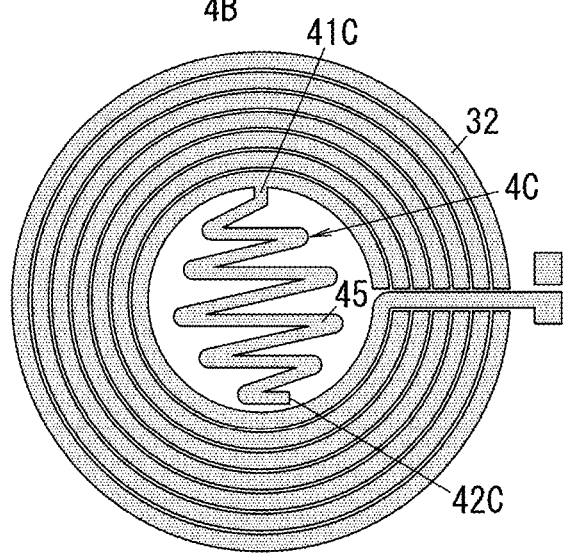
FIG. 5C is a front view of a second coil conductor portion and a heat dissipation conductor of an antenna device according to a third modification of the first preferred embodiment of the present invention.

As a third modification of the first preferred embodiment, the antenna device 1 may include a heat dissipation conductor 4C having a serpentine shape as illustrated in FIG. 5C instead of the plurality of heat dissipation conductors 4. The heat dissipation conductor 4C includes a connection end 41C, an open end 42C, and a meandering conductor portion 45 connected to the connection end 41C.

As another modification of the first preferred embodiment, the antenna device 1 may not include the magnetic body 5. That is, the magnetic body 5 is not a required element.

The shape of the coil conductor 3 is not limited to a circular shape. The coil conductor 3 may alternatively have an elliptical shape, or may have a quadrangular shape such as a rectangular shape or a square shape, in a plan view from the first direction D1. Alternatively, the coil conductor 3 may have a polygonal shape other than the quadrangular shape.

Furthermore, the coil conductor 3 is not limited to the two-layer structure of the first coil conductor portion 31 and the second coil conductor portion 32, and may have a structure including three or more layers. In short, the coil conductor 3 may include three or more coil conductor portions.

Furthermore, the number of loops (the number of turns) of the first coil conductor portion 31 is not limited to seven. The first coil conductor portion 31 may be provided in a state of being wound equal to or less than about six times, or may be provided in a state of being wound equal to or more than about eight times.

In the same or substantially the same manner, the number of loops (the number of turns) of the second coil conductor portion 32 is not also limited to seven. The second coil conductor portion 32 may be provided in a state of being wound equal to or less than about six times, or may be provided in a state of being wound equal to or more than about eight times.

Furthermore, the antenna device 1 may include a base made of, for example, a magnetic material instead of the base 2 made of the electrically insulating material such as a resin or the like. In the case where the base is made of the magnetic material as well, the coil conductor 3 is directly provided on the base of the magnetic material. In addition, in the case where the base is made of the magnetic material, the base can also define and function as the magnetic body 5. With this configuration, a thickness of the antenna device 1 in the first direction D1 is able to be reduced.

The antenna device 1 according to each of the above-described modifications also achieves the same or substantially the same advantageous effects as those of the antenna device 1 according to the first preferred embodiment.

Second Preferred Embodiment

Figure 6A:
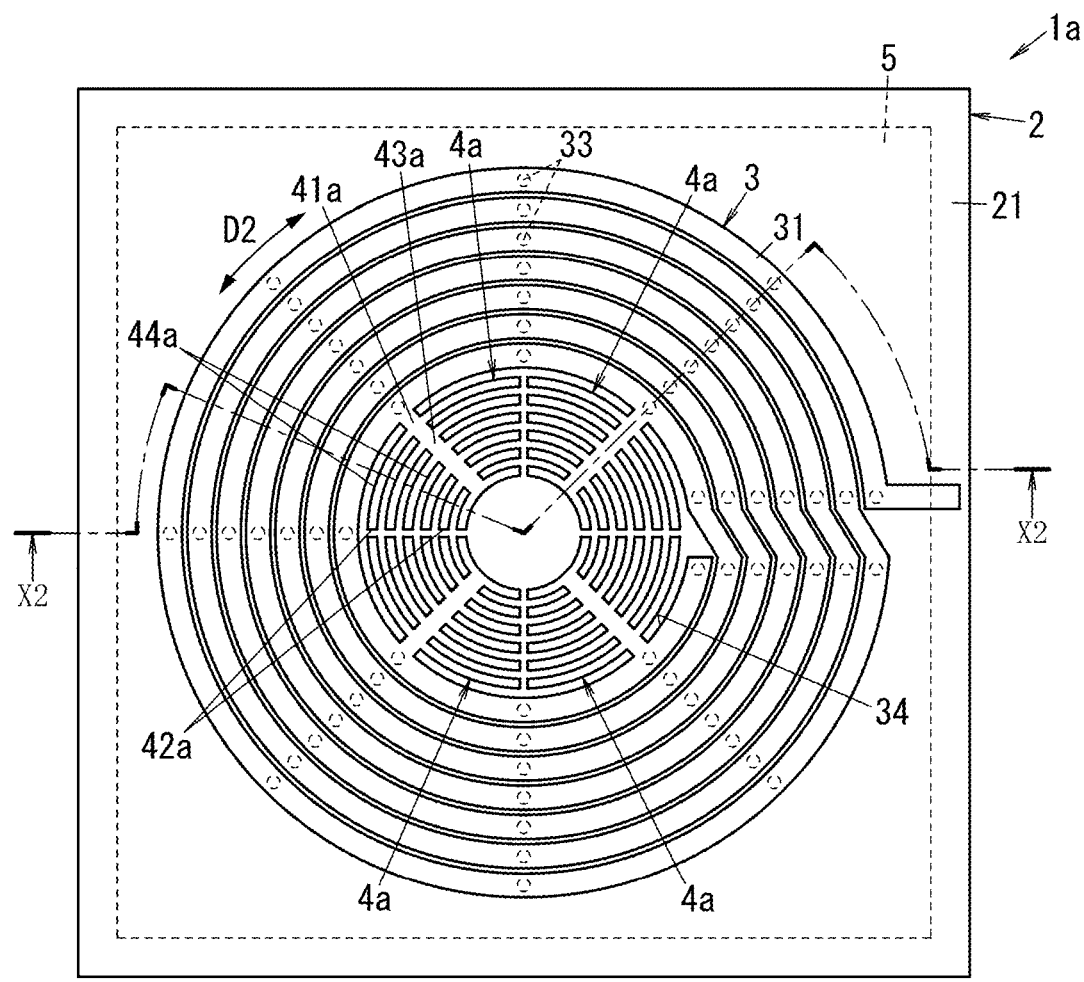
FIG. 6A is a front view of an antenna device according to a second preferred embodiment of the present invention.
Figure 6B:
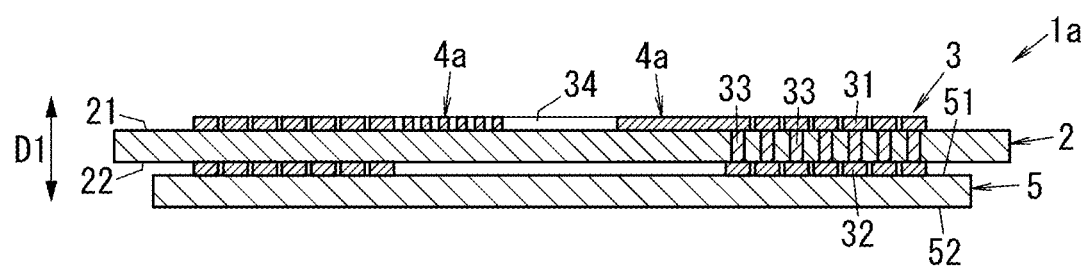
FIG. 6B is a cross-sectional view of the above-described antenna device, taken along a line X2-X2 in FIG. 6A.

An antenna device 1a according to a second preferred embodiment of the present invention is preferably different from the antenna device 1 (see FIGS. 1A and 1B) according to the first preferred embodiment in a point that a plurality of (for example, four in the illustrated example) heat dissipation conductors 4a is connected to the first coil conductor portion 31, as illustrated in FIGS. 6A and 6B. Note that in the antenna device 1a according to the second preferred embodiment, the same or similar elements as those of the antenna device 1 according to the first preferred embodiment are denoted by the same reference numerals, and description thereof will be omitted.

The antenna device 1a includes the plurality of (for example, four in the illustrated example) heat dissipation conductors 4a as illustrated in FIGS. 6A and 6B instead of the plurality of heat dissipation conductors 4.

Figure 7:
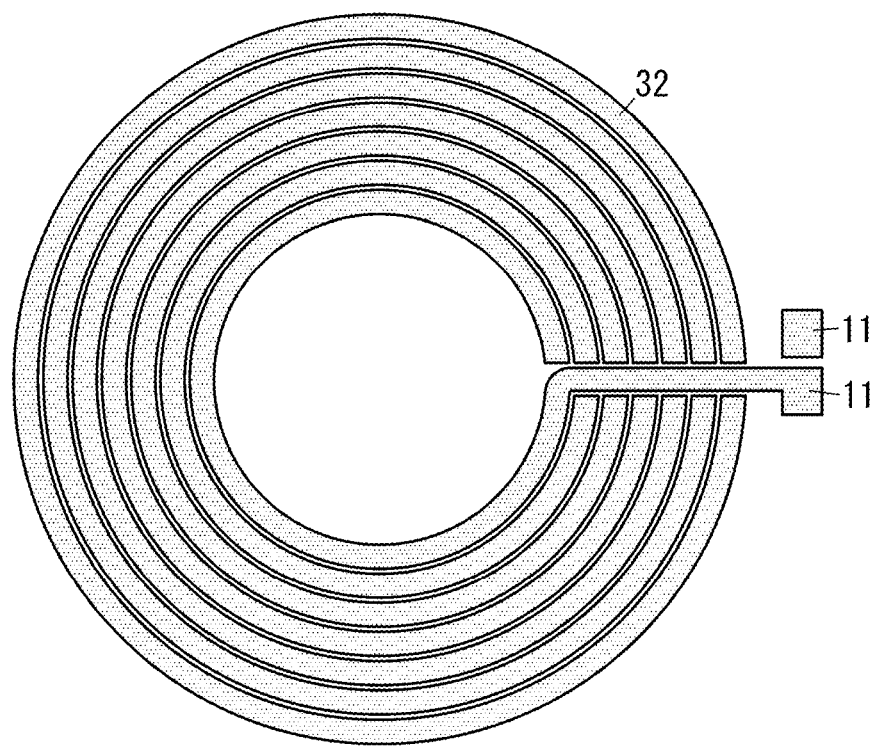
FIG. 7 is a front view of a second coil conductor portion of the above-described antenna device.

Each of the plurality of heat dissipation conductors 4a is provided on the first main surface 21 of the base 2. That is, each of the heat dissipation conductors 4a is provided adjacent to the first coil conductor portion 31 of the coil conductor 3. In the same or substantially the same manner as the heat dissipation conductor 4, each of the heat dissipation conductors 4a includes a connection end 41a, a plurality of (for example, 12 in the illustrated example) open ends 42a, a first conductor portion 43a, and a plurality of (for example, 12 in the illustrated example) second conductor portions 44a. Note that for the heat dissipation conductor 4a of the second preferred embodiment, the same or substantially the same configuration and function as those of the heat dissipation conductor 4 (see FIGS. 1A and 1B) of the first preferred embodiment will not be described. As illustrated in FIG. 7, the heat dissipation conductor 4a is not directly connected to the second coil conductor portion 32 of the second preferred embodiment.

Figure 8:
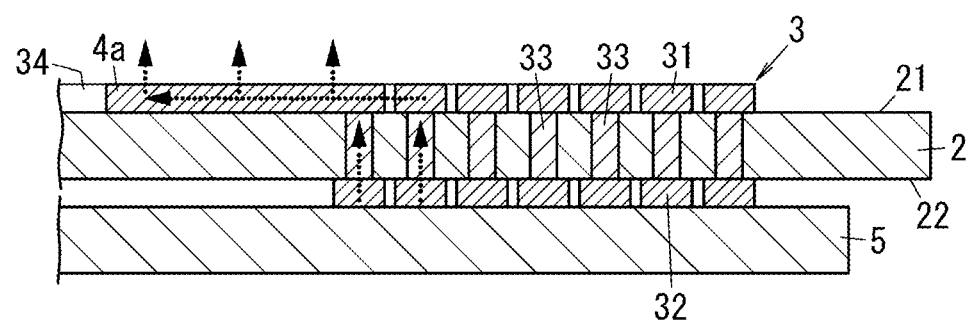
FIG. 8 is a schematic diagram for explaining operations of the above-described antenna device.

Next, heat conduction in the antenna device 1a according to the second preferred embodiment will be described with reference to FIG. 8. The arrows in FIG. 8 indicate an example of heat flow.

First, the heat generated in the first coil conductor portion 31 of the coil conductor 3 is transmitted to the heat dissipation conductor 4a provided on the first main surface 21 of the base 2 in the same or substantially the same manner as the first coil conductor portion 31. The heat transmitted to the heat dissipation conductor 4a is emitted to the outside while being transmitted toward the center of gravity of the coil conductor 3 in the heat dissipation conductor 4a.

On the other hand, the heat generated in the second coil conductor portion 32 of the coil conductor 3 is transmitted to the first coil conductor portion 31 through the plurality of via conductors 33. The heat transmitted to the first coil conductor portion 31 through the plurality of via conductors 33 is transmitted to the heat dissipation conductor 4a. The heat transmitted to the heat dissipation conductor 4a is emitted to the outside from the heat dissipation conductor 4a while being transmitted toward the center of gravity of the coil conductor 3 in the heat dissipation conductor 4a.

With this configuration, the heat generated in the coil conductor 3 is able to be dissipated to the outside by the heat dissipation conductor 4a.

Note that as an example of the use, the antenna device 1a according to the second preferred embodiment is preferably used in the electronic apparatus 7 (see FIG. 4A) in the same or substantially the same manner as the antenna device 1 according to the first preferred embodiment.

As described above, in the antenna device 1a according to the second preferred embodiment as well, it is possible to improve the heat dissipation property while securing easy passage of magnetic flux through the opening 34 of the coil conductor 3. Furthermore, since a distance between the heat dissipation conductor 4a and the conductor provided on the second main surface 52 side (back side) of the magnetic body 5 is widened, parasitic capacitance of the coil is able to be reduced, and a loss due to the parasitic capacitance is thus able to be reduced.

As modifications of the second preferred embodiment, the antenna device 1a may include the heat dissipation conductors 4A to 4C as illustrated in FIGS. 5A to 5C.

In the antenna device 1a according to each of the above-described modifications as well, in the same manner as the antenna device 1a according to the second preferred embodiment, it is possible to improve the heat dissipation property while securing easy passage of magnetic flux through the opening 34 of the coil conductor 3. Furthermore, the parasitic capacitance of the coil is able to be reduced, and a loss due to the parasitic capacitance is thus able to be reduced.

Third Preferred Embodiment

Figure 9A:
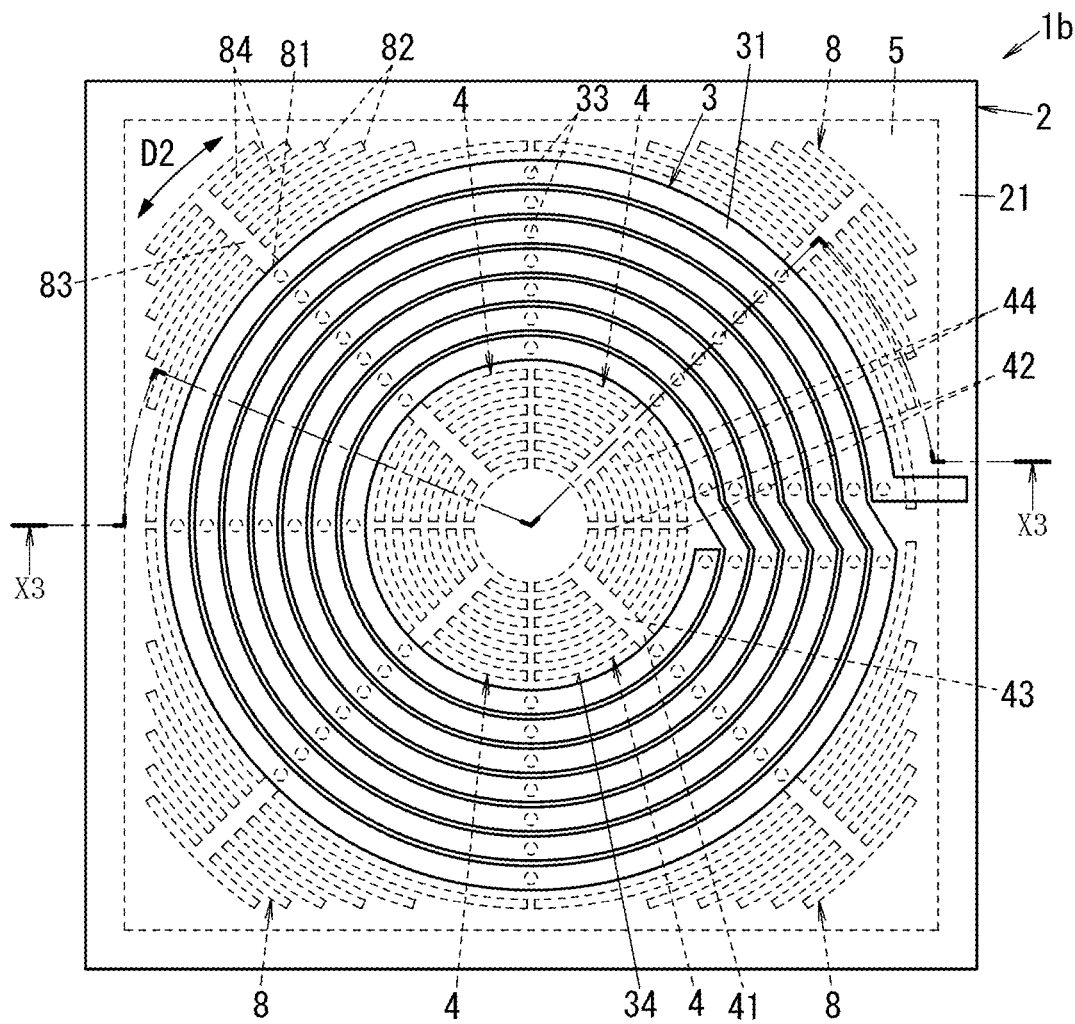
FIG. 9A is a front view of an antenna device according to a third preferred embodiment of the present invention.
Figure 9B:
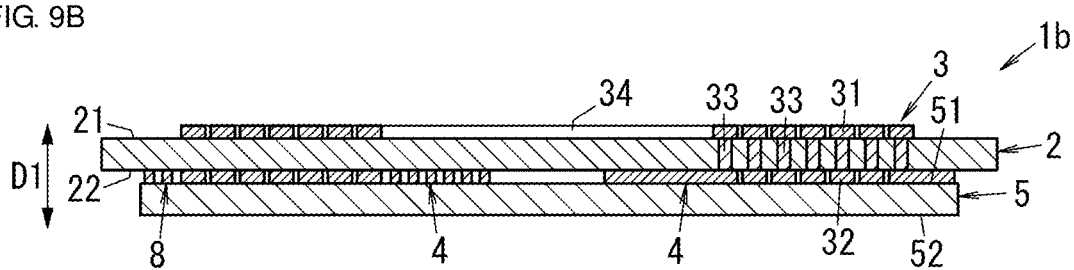
FIG. 9B is a cross-sectional view of the above-described antenna device, taken along a line X3-X3 in FIG. 9A.

An antenna device 1b according to a third preferred embodiment is preferably different from the antenna device 1 (see FIGS. 1A and 1B) according to the first preferred embodiment in a point of including a plurality of (for example, four in the illustrated example) heat dissipation conductors 8 in an outer side portion of the coil conductor 3, as illustrated in FIGS. 9A and 9B. Note that in the antenna device 1b according to the third preferred embodiment, the same or similar elements as those of the antenna device 1 according to the first preferred embodiment are denoted by the same reference numerals, and description thereof will be omitted.

Figure 10:
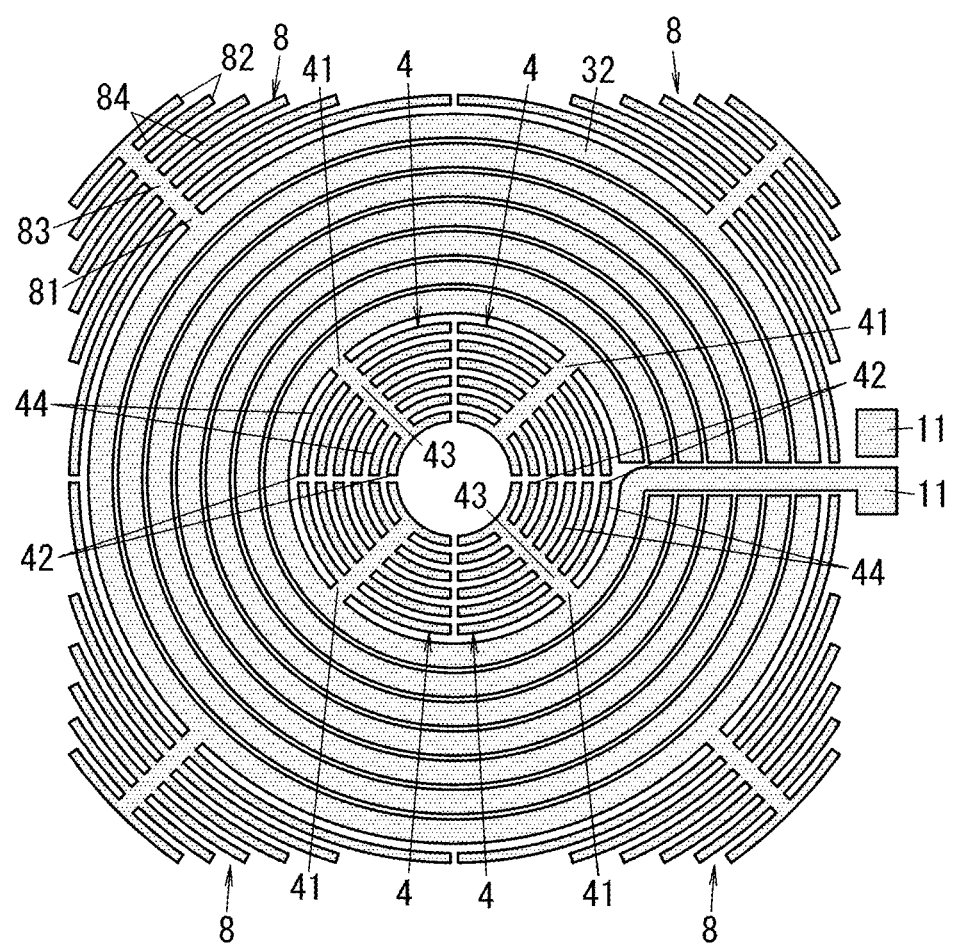
FIG. 10 is a front view of a second coil conductor portion and a heat dissipation conductor of the above-described antenna device.

The antenna device 1b preferably includes the plurality of (for example, four in the illustrated example) heat dissipation conductors 8 as illustrated in FIGS. 9A, 9B, and FIG. 10 in addition to the plurality of heat dissipation conductors 4.

Each of the plurality of heat dissipation conductors 8 is positioned in an outer side portion relative to the outermost circumference of the coil conductor 3. Each of the heat dissipation conductors 8 is directly connected to the second coil conductor portion 32 of the coil conductor 3.

Each of the heat dissipation conductors 8 preferably includes a connection end 81 and a plurality of (for example, 12 in the illustrated example) open ends 82. The connection end 81 is connected to the coil conductor 3. Each of the plurality of open ends 82 is an end that is different from the connection end 81.

Each of the heat dissipation conductors 8 includes a first conductor portion 83 and a plurality of (, for example, 12 in the illustrated example) second conductor portions 84. The first conductor portion 83 is connected to the connection end 81 and extends in the direction intersecting with the winding direction D2 of the coil conductor 3 in a plan view of the coil conductor 3. Each of the plurality of second conductor portions 84 extends from the first conductor portion 83 along the winding direction D2 of the coil conductor 3 in a plan view of the coil conductor 3.

Note that as an example of the use, the antenna device 1b according to the third preferred embodiment is preferably used in the electronic apparatus 7 (see FIG. 4A) in the same or substantially the same manner as the antenna device 1 according to the first preferred embodiment.

In the antenna device 1b according to the third preferred embodiment, the heat dissipation conductor 8 is positioned in an outer side portion relative to the outermost circumference of the coil conductor 3. With this configuration, the heat dissipation conductor 8 is able to be provided by using an area wider than the opening 34 of the coil conductor 3, and thus the heat dissipation property is able to be further improved.

Figure 11:
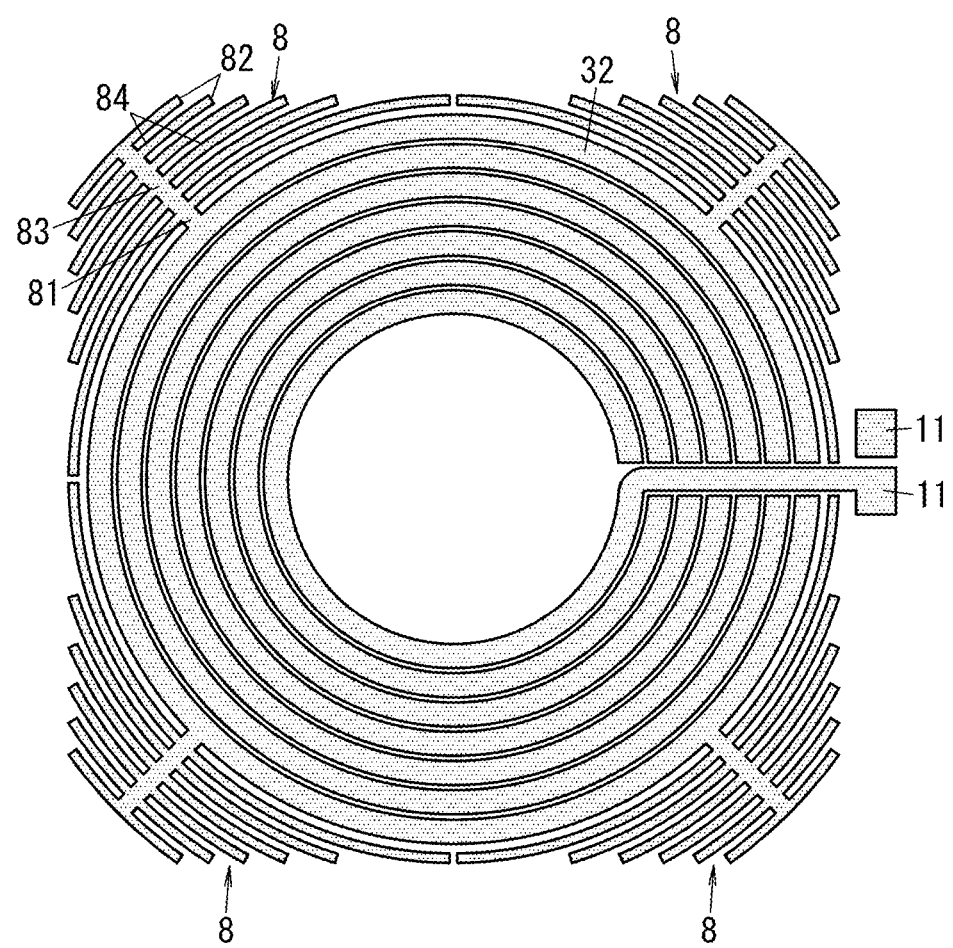
FIG. 11 is a front view of a second coil conductor portion and a heat dissipation conductor of an antenna device according to a modification of the third preferred embodiment of the present invention.

Note that as a modification of the third preferred embodiment, the antenna device 1b is not limited to including both of the plurality of heat dissipation conductors 4 and the plurality of heat dissipation conductors 8, and may include only the plurality of (for example, four in the illustrated example) heat dissipation conductors 8 as illustrated in FIG. 11.

Additionally, the number of heat dissipation conductors 8 is not limited to four, and may be equal to or less than three, or equal to or more than five. In short, it is sufficient for the antenna device 1b to be provided with at least one heat dissipation conductor 8.

Furthermore, in a case where the magnitudes of the potential variation of the two connection terminals 11 are different from each other as in a case of being used for Qi or the like, the heat dissipation conductor 8 is preferably closer to the connection terminal 11 having a smaller potential variation than to the connection terminal 11 having a larger potential variation in the current path on the coil conductor 3. The influence on the circuit due to the parasitic capacitance caused by the heat dissipation conductor 8 and the other metal is able to be reduced.

As modifications of the third preferred embodiment, the antenna device 1b may include the heat dissipation conductors 4A to 4C as illustrated in FIGS. 5A to 5C instead of the plurality of heat dissipation conductors 4.

The antenna device 1b according to each of the above-described modifications also achieves the same or substantially the same advantageous effects as those of the antenna device 1b according to the third preferred embodiment.

Fourth Preferred Embodiment

Figure 12A:
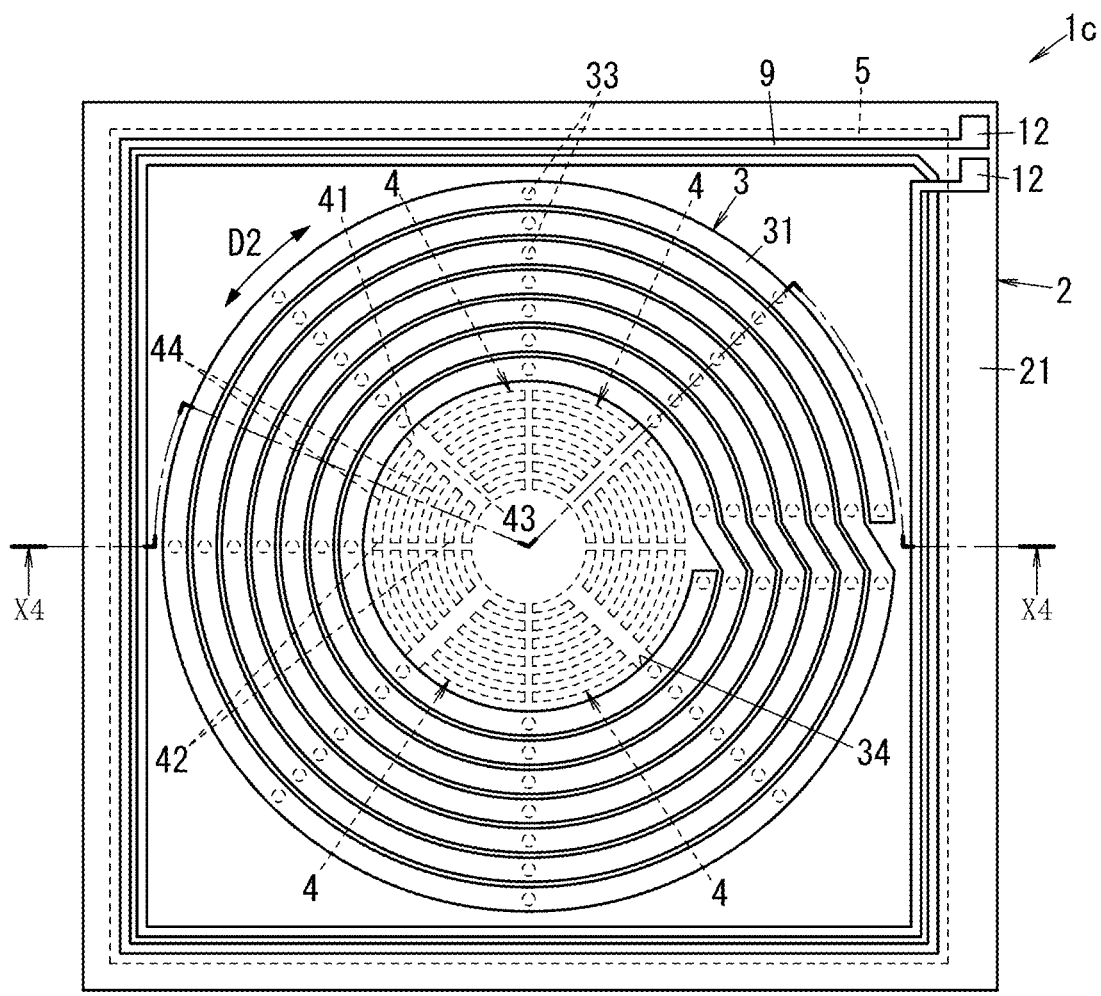
FIG. 12A is a front view of an antenna device according to a fourth preferred embodiment of the present invention.
Figure 12B:
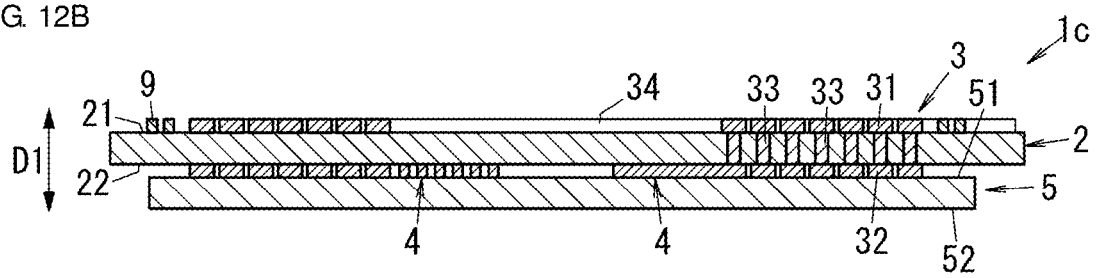
FIG. 12B is a cross-sectional view of the above-described antenna device, taken along a line X4-X4 in FIG. 12A.

An antenna device 1c according to a fourth preferred embodiment is preferably different from the antenna device 1 (see FIGS. 1A and 1B) according to the first preferred embodiment in a point of including a coil conductor 9 together with the coil conductor 3, as illustrated in FIGS. 12A and 12B. Note that in the antenna device 1c according to the fourth preferred embodiment, the same or substantially the same elements as those of the antenna device 1 according to the first preferred embodiment are denoted by the same reference numerals, and description thereof will be omitted.

As illustrated in FIGS. 12A and 12B, the antenna device 1c according to the fourth preferred embodiment includes the coil conductor 9. Additionally, the antenna device 1c further includes two connection terminals 12.

The coil conductor 9 is provided in an outer side portion relative to the outermost circumference of the coil conductor 3, and is used as an antenna for short-range wireless communication. More specifically, the coil conductor 9 is provided on the first main surface 21 of the base 2.

As illustrated in FIG. 12A, the two connection terminals 12 are provided on the base 2 in order to electrically connect the circuit board 71 (see FIG. 4A) of the electronic apparatus 7 and the coil conductor 9. The two connection terminals 12 are connected to both ends of the coil conductor 9, respectively, and are electrically insulated from portions other than both the ends of the coil conductor 9.

Note that as an example of the use, the antenna device 1c according to the fourth preferred embodiment is preferably used in the electronic apparatus 7 (see FIG. 4A) in the same or substantially the same manner as the antenna device 1 according to the first preferred embodiment.

In the above-described antenna device 1c according to the fourth preferred embodiment as well, it is possible to improve the heat dissipation property while securing easy passage of magnetic flux through the opening 34 of the coil conductor 3. Furthermore, by using the configuration in which the heat dissipation conductor 4 is provided in the opening 34 of the coil conductor 3 and the heat dissipation conductor 4 is not disposed on the outer circumferential side of the coil conductor 3, it is possible to reduce the possibility that the heat dissipation conductor 4 and the coil conductor 9 are electrically conducted to each other.

Note that in the antenna device 1c, for example, antennas used in power feed method of different standards may be included as a plurality of coil antennas. Specifically, the antenna device 1c may include both an antenna for Qi and an antenna for A4WP as the plurality of coil antennas.

As modifications of the fourth preferred embodiment, the antenna device 1c may include the heat dissipation conductors 4A to 4C as illustrated in FIGS. 5A to 5C instead of the plurality of heat dissipation conductors 4.

The antenna device 1c according to each of the above-described modifications also achieves the same or substantially the same advantageous effects as those of the antenna device 1c according to the fourth preferred embodiment.

SUMMARY

The following arrangements correspond to the preferred embodiments and modifications described above.

An antenna device (1; 1a; 1b; 1c) according to a preferred embodiment of the present invention performs wireless transmission through magnetic field coupling. The antenna device (1; 1a; 1b; 1c) includes a base (2), a coil conductor (3), and a heat dissipation conductor (4; 4A to 4C; 4a; 8). The coil conductor (3) is provided on the base (2) and wound in a spiral shape. The heat dissipation conductor (4; 4A to 4C; 4a; 8) is connected to the coil conductor (3). The heat dissipation conductor (4; 4A to 4C; 4a; 8) has a connection end (41; 41A to 41C; 41a; 81) and an open end (42; 42A to 42C; 42a; 82). The connection end (41; 41A to 41C; 41a; 81) is connected to the coil conductor (3). The open end (42; 42A to 42C; 42a; 82) is an end different from the connection end (41; 41A to 41C; 41a; 81).

According to an antenna device (1; 1a; 1b; 1c) according to a preferred embodiment of the present invention, it is possible to improve a heat dissipation property while securing easy passage of magnetic flux through an opening (34) of the coil conductor (3).

In an antenna device (1; 1a; 1b; 1c) according to a preferred embodiment of the present invention, the heat dissipation conductor (4; 4A; 4B; 4a; 8) includes a first conductor portion (43; 43A; 43B; 43a; 83). The first conductor portion (43; 43A; 43B; 43a; 83) is connected to the connection end (41; 41A; 41B; 41a; 81) and extends from the connection end (41; 41A; 41B; 41a; 81) in a direction intersecting with a winding direction (D2) of the coil conductor (3) in a plan view of the coil conductor (3).

According to an antenna device (1; 1a; 1b; 1c) according to a preferred embodiment of the present invention, the heat is able to be transmitted to a region having low temperature (a region close to the center of gravity of the coil conductor (3)).

In an antenna device (1; 1a; 1b; 1c) according to a preferred embodiment of the present invention, the heat dissipation conductor (4; 4A; 4a; 8) further includes a second conductor portion (44; 44A; 44a; 84). The second conductor portion (44; 44A; 44a; 84) is connected to the first conductor portion (43; 43A; 43a; 83), and extends from the first conductor portion (43; 43A; 43a; 83) along the winding direction (D2) of the coil conductor (3) in a plan view of the coil conductor (3).

According to an antenna device (1; 1a; 1b; 1c) according to a preferred embodiment of the present invention, the heat dissipation region is able to be increased, and thus the heat dissipation property is able to be improved in a limited space.

In an antenna device (1; 1a; 1c) according to a preferred embodiment of the present invention, the coil conductor (3) has an opening (34). The heat dissipation conductor (4; 4A to 4C; 4a) is positioned within the opening (34) of the coil conductor (3) in a plan view of the base (2).

According to an antenna device (1; 1a; 1c) according to a preferred embodiment of the present invention, the heat dissipation property is able to be improved without changing the area of the entire antenna device (1; 1a; 1c).

In an antenna device (1b) according to a preferred embodiment of the present invention, the heat dissipation conductor (8) is positioned in an outer side portion relative to the outermost circumference of the coil conductor (3) in a plan view of the base (2).

According to an antenna device (1b) according to a preferred embodiment of the present invention, the heat dissipation conductor (8) is able to be provided using an area wider than the opening (34) of the coil conductor (3), and thus the heat dissipation property is able to be further improved.

An antenna device (1; 1a; 1b; 1c) according to a preferred embodiment of the present invention further includes, a magnetic body (5). At least a part of the magnetic body (5) overlaps with the coil conductor (3) in a plan view of the base (2).

According to an antenna device (1; 1a; 1b; 1c) according to a preferred embodiment of the present invention, a desired inductance is able to be obtained.

Furthermore, according to an antenna device (1; 1a; 1b; 1c) according to a preferred embodiment of the present invention, the heat is able to be transmitted from the coil conductor (3) to the magnetic body (5), and thus the heat dissipation property is able to be improved.

An antenna device (1) according to a preferred embodiment of the present invention further includes, a thermal diffusion member (6). The thermal diffusion member (6) is a member having thermal conductivity higher than that of the base (2). The thermal diffusion member (6) overlaps with at least the heat dissipation conductor (4; 4A to 4C) in a plan view of the base (2).

According to an antenna device (1) according to a preferred embodiment of the present invention, the heat transmitted to the heat dissipation conductor (4; 4A to 4C) is able to be transmitted to the thermal diffusion member (6), and thus the heat dissipation property is able to be further improved.

An antenna device (1) according to a preferred embodiment of the present invention further includes, a magnetic body (5) and a thermal diffusion member (6). At least a portion of the magnetic body (5) overlaps with the coil conductor (3) in a plan view of the base (2). The thermal diffusion member (6) is a member having thermal conductivity higher than that of the base (2). The coil conductor (3) includes an opening (34). The heat dissipation conductor (4; 4A to 4C) is positioned within the opening (34) of the coil conductor (3) in a plan view of the base (2). The thermal diffusion member (6) extends from the opening (34) to an outer side portion relative to the outermost circumference of the coil conductor (3) over the coil conductor (3) in a plan view of the base (2).

According to an antenna device (1) according to a preferred embodiment of the present invention, the heat dissipation property in the thermal diffusion member (6) is able to be further improved.

In an antenna device (1; 1a; 1b; 1c) according to a preferred embodiment of the present invention, the base (2) has a first main surface (21) and a second main surface (22) opposing each other. The coil conductor (3) includes a first coil conductor portion (31), a second coil conductor portion (32), and a plurality of via conductors (33). The first coil conductor portion (31) is provided on the first main surface (21). The second coil conductor portion (32) is provided on the second main surface (22). The plurality of via conductors (33) connects the first coil conductor portion (31) and the second coil conductor portion (32) to each other.

According to an antenna device (1; 1a; 1b; 1c) according to a preferred embodiment of the present invention, a resistance component of the coil conductor (3) is able to be reduced.

In an antenna device (1; 1a; 1b; 1c) according to a preferred embodiment of the present invention, at least one of the plurality of via conductors (33) is provided at a portion where the coil conductor (3) and the heat dissipation conductor (4; 4A to 4C; 4a; 8) are connected to each other.

According to an antenna device (1; 1a; 1b; 1c) according to a preferred embodiment of the present invention, heat conduction from the first coil conductor portion (31) and the second coil conductor portion (32) to the heat dissipation conductor (4; 4A to 4C; 4a; 8) is able to be improved.

In an antenna device (1; 1a; 1b; 1c) according to a preferred embodiment of the present invention, the antenna device (1; 1a; 1b; 1c) is preferably used in a wireless charging system.

An electronic apparatus (7) according to a preferred embodiment of the present invention includes an antenna device (1; 1a; 1b; 1c), a circuit board (71), and a housing (72). The antenna device (1; 1a; 1b; 1c) performs wireless transmission through magnetic field coupling. The circuit board (71) includes a system circuit that operates the antenna device (1; 1a; 1b; 1c). The housing (72) accommodates the antenna device (1; 1a; 1b; 1c) and the circuit board (71). The antenna device (1; 1a; 1b; 1c) includes a base (2), a coil conductor (3), and a heat dissipation conductor (4; 4A to 4C; 4a; 8). The coil conductor (3) is provided on the base (2) and wound in a spiral shape. The heat dissipation conductor (4; 4A to 4C; 4a; 8) is connected to the coil conductor (3). The heat dissipation conductor (4; 4A to 4C; 4a; 8) has a connection end (41; 41A to 41C; 41a; 81) and an open end (42; 42A to 42C; 42a; 82). The connection end (41; 41A to 41C; 41a; 81) is connected to the coil conductor (3). The open end (42; 42A to 42C; 42a; 82) is an end different from the connection end (41; 41A to 41C; 41a; 81).

According to an electronic apparatus (7) according to a preferred embodiment of the present invention, in the antenna device (1; 1a; 1b; 1c), it is possible to improve a heat dissipation property while securing easy passage of magnetic flux through an opening (34) of the coil conductor (3).

In an electronic apparatus (7) according to a preferred embodiment of the present invention, the housing (72) has a lengthwise direction and a widthwise direction. The antenna device (1; 1a; 1b; 1c) further includes a thermal diffusion member (6). The thermal diffusion member (6) is a member having thermal conductivity higher than that of the base (2). The thermal diffusion member (6) overlaps with at least the heat dissipation conductor (4; 4A to 4C; 4a; 8), and extends to an edge end portion of the housing (72) in the widthwise direction (D32) of the housing (72). in a plan view of the base.

According to an electronic apparatus (7) according to a preferred embodiment of the present invention, heat conduction from the thermal diffusion member (6) to the housing (72) is able to be increased, and thus the heat dissipation property is able to be further improved.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An antenna device configured to perform wireless transmission through magnetic field coupling, the antenna device comprising:
a base;
a coil conductor provided on the base, wound in a spiral shape, and including an opening; and
a heat dissipation conductor connected to the coil conductor; wherein
the heat dissipation conductor includes:
a connection end connected to the coil conductor, and an open end different from the connection end; and
the heat dissipation conductor is positioned in at least one of an inside of the opening of the coil conductor and an outer side portion relative to an outermost circumference of the coil conductor in a plan view of the base.

2. The antenna device according to claim 1, wherein the heat dissipation conductor includes a first conductor portion connected to the connection end and extending from the connection end in a direction intersecting with a winding direction of the coil conductor in a plan view of the coil conductor.

3. The antenna device according to claim 2, wherein the heat dissipation conductor further includes a second conductor portion connected to the first conductor portion and extending from the first conductor portion along the winding direction of the coil conductor in a plan view of the coil conductor.

4. The antenna device according to claim 1, the antenna device further comprising a magnetic body at least a portion of which overlaps with the coil conductor in a plan view of the base.

5. The antenna device according to claim 1, the antenna device further comprising:
a thermal diffusion member having a thermal conductivity higher than a thermal conductivity of the base; wherein
the thermal diffusion member overlaps with at least the heat dissipation conductor in a plan view of the base.

6. An electronic apparatus, comprising:
a circuit board;
a housing; and
the antenna device of claim 5; wherein
the thermal diffusion member is positioned adjacent to or in direct contact with an edge of the housing such that heat is transmitted from the thermal diffusion member to the housing.

7. The antenna device according to claim 1, the antenna device further comprising:
a magnetic body at least a portion of which overlaps with the coil conductor in a plan view of the base; and
a thermal diffusion member having thermal conductivity higher than thermal conductivity of the base; wherein
the coil conductor includes an opening;
the heat dissipation conductor is positioned within the opening of the coil conductor in a plan view of the base; and
the thermal diffusion member extends from the opening to an outer side portion relative to an outermost circumference of the coil conductor over the coil conductor in a plan view of the base.

8. The antenna device according to claim 1, wherein
the base includes a first main surface and a second main surface opposing each other; and
the coil conductor includes:
a first coil conductor portion provided on the first main surface;
a second coil conductor portion provided on the second main surface; and
a plurality of via conductors connecting the first coil conductor portion and the second coil conductor portion to each other.

9. The antenna device according to claim 8, wherein at least one of the plurality of via conductors is provided at a portion where the coil conductor and the heat dissipation conductor are connected to each other.

10. The antenna device base according to claim 8, wherein the first coil conductor portion and the second coil conductor portion are electrically connected to each other in parallel.

11. The antenna device according to claim 8, further comprising:
a magnetic body at least a portion of which overlaps with the coil conductor in a plan view of the base; wherein
the second coil conductor portion is located closer to the magnetic body than this first coil conductor is.

12. The antenna device according to claim 1, wherein the antenna device is used in a wireless charging system.

13. The antenna device according to claim 1, wherein two of the heat dissipation conductors are connected to the coil conductor.

14. The antenna device according to claim 1, wherein the heat dissipation conductor has a serpentine shape between the connection end and the open end.

15. The antenna device according to claim 1, wherein the base is made of a magnetic material.

16. The antenna device according to claim 1, wherein a plurality of the heat dissipation conductors are connected to the coil conductor, one of the plurality of the heat dissipation conductors being provided inside of the opening of the coil conductor and another one of the plurality of the heat dissipation conductors being provided on the outer side portion relative to the outermost circumference of the coil conductor in a plan view of the base.

17. The antenna device according to claim 1, wherein four of the heat dissipation conductors are provided on the outer side portion relative to the outermost circumference of the coil conductor in a plan view of the base.

18. The antenna device according to claim 1, further comprising an additional coil conductor provided in the outer side portion relative to the outermost circumference of the coil conductor.

19. An electronic apparatus comprising:
an antenna device that performs wireless transmission through magnetic field coupling;
a circuit board including a system that operates the antenna device; and
a housing that accommodates the antenna device and the circuit board; wherein
the antenna device includes:
a base;
a coil conductor provided on the base and wound in a spiral shape, and including an opening; and
a heat dissipation conductor connected to the coil conductor; and
the heat dissipation conductor includes:
a connection end connected to the coil conductor; and
an open end different from the connection end; and
the heat dissipation conductor is positioned in at least one of an inside of the opening of the coil conductor and an outer side portion relative to an outermost circumference of the coil conductor in a plan view of the base.

20. The electronic apparatus according to claim 19, wherein
- the housing has a lengthwise direction and a widthwise direction;
- the antenna device further includes a thermal diffusion member having thermal conductivity higher than thermal conductivity of the base; and
- the thermal diffusion member overlaps with at least the heat dissipation conductor and extends to an edge end portion of the housing in the widthwise direction of the housing in a plan view of the base.

* * * * *